United States Patent [19]
Utz

[11] Patent Number: 5,895,723
[45] Date of Patent: Apr. 20, 1999

[54] COMPOSITE FILMS

[75] Inventor: Helmar Utz, Freising, Germany

[73] Assignee: Fraunhofer-Gesellschaft zur Foerderung der angewandten Forschung e.V., München, Germany

[21] Appl. No.: 08/297,558

[22] Filed: Aug. 26, 1994

[30] Foreign Application Priority Data

Aug. 26, 1993 [DE] Germany .................. 43 28 767

[51] Int. Cl.⁶ .................. B32B 23/04; B32B 27/06; B32B 27/32; B32B 27/36
[52] U.S. Cl. .................. 428/480; 428/411.1; 428/474.4; 428/412; 428/523; 428/532
[58] Field of Search .................. 428/480, 411.1, 428/412, 474.4, 523, 532

[56] References Cited

U.S. PATENT DOCUMENTS

| | | | |
|---|---|---|---|
| 4,511,419 | 4/1985 | Kuhlmann et al. | 156/272.6 |
| 4,740,385 | 4/1988 | Feuerstein et al. | 427/38 |

FOREIGN PATENT DOCUMENTS

| | | |
|---|---|---|
| 0026106 | 4/1981 | European Pat. Off. |
| 0064219 | 11/1982 | European Pat. Off. |
| 0460796A3 | 12/1991 | European Pat. Off. |
| 0545863A1 | 6/1993 | European Pat. Off. |
| 0550039A3 | 7/1993 | European Pat. Off. |
| 3300411A1 | 7/1983 | Germany. |
| 2064427 | 6/1981 | United Kingdom. |

OTHER PUBLICATIONS

Haefer, R.A., "Beschichtungen von Oberflächen", Oberflächen– Und Dünnschicht–Technologie, Teil I, Berlin, Springer–Verlag, (1987), pp. 180–181, 272–295.

*Primary Examiner*—Kriellion S. Morgan

[57] ABSTRACT

A process for fabrication of a composite film including two films, includes: depositing by evaporation in a vacuum at least one intermediate functional layer which is non-metallic and transparent, and which functions as at least one of a barrier layer or a bonding layer, onto at least one of the two films; and joining the two films under conditions effective to create a bond therebetween; wherein, when at least one intermediate functional layer is deposited onto each of the two films, these two films are joined together along the surfaces thereof which carry the deposited at least one intermediate functional layer, and when at least one intermediate functional layer is deposited onto only one film of the two films, the one film is joined to the other of the two films along the surface of the one film which carries the deposited at least one intermediate functional layer.

20 Claims, 3 Drawing Sheets

COMPOSITE FILMS

CROSS-REFERENCE TO RELATED APPLICATIONS

The present application claims the right of foreign priority with respect to Application No. P 43 28 767.0 filed in Germany on Aug. 26, 1993, the subject matter of which is incorporated herein by reference.

BACKGROUND OF THE INVENTION

1. Field of the Invention

The present invention relates to a process for depositing transparent, non-metallic, functional intermediate layers using selected starting compounds between two films in an, as such, known manner in vacuum, as well as to a composite film produced with this process.

2. Description of the Related Art

Composite films composed of two films and a bonding layer having specific functions are known. There are composite films which have an intermediate functional layer which is permeable to light and simultaneously acts as a barrier, i.e., a gas-permeability-diminishing barrier layer. Other intermediate functional layers are known which are permeable to light but which are simultaneously provided with electrically conductive layers.

Intermediate functional layers have also been fabricated which are layers which are transparent in the visible radiation range but which reflect infrared radiation.

Various processes are utilized for the fabrication of film composites of this type.

The most commonly applied processes include coextrusion, (co-) extrusion coating, extrusion lamination, and lining film formation wherein two sheets of film are joined with the aid of an adhesive.

Films having vacuum deposited functional layers of, e.g., aluminum or $SiO_x$, as a barrier layer for gases or aromatic materials are made nearly exclusively into composites by lining film formation. Depositing a second film yields good composite sealing properties and simultaneously the very sensitive, vacuum evaporated layers are protected against mechanical stress or environmental influences, because the thin functional layer is embedded between two thicker films.

So-called "vapor deposited" films require extremely careful handling both during production and subsequent processing, because even only a little mechanical stress distinctly impairs the barrier properties of such films.

For environmental purposes, products are designed today in such a manner that they can be recycled after use. This is especially the case with packaging materials. From this aspect, composites present a big problem due to the many different materials involved. For this reason, an attempt has been made to use base film materials which are as uniform as possible and therefore to permit better joint recycling. Thus, for example, pure polyolefin composites having a $SiO_x$ barrier layer are known. In order to fabricate a composite of this type, however, it is presently necessary to use lining adhesives which develop an unmeltable lattice after hardening. This lattice makes recycling difficult.

In order to achieve improved environmental compatibility, an attempt has been also made to develop biologically degradable and compostable packaging materials. The chief disadvantage of the presently-available biodegradable plastics is their poor barrier properties, in particular, for water vapor. For this reason, an attempt has been made to improve the barrier properties by employing a vacuum coating. Like conventional "vapor deposited" films, "vapor deposited" biodegradable films are extremely sensitive to mechanical stress encountered during fabrication and subsequent processing impairing the integrity of the barrier. The vacuum evaporated layers, therefore, have to be embedded, such as, between two films, varnished, etc., to protect them. In order to obtain good sealing properties, moreover, it is necessary to deposit a sealing layer on the vapor deposited biodegradable films. As in conventional composites, this can be accomplished with lining technology. The lining adhesives employed for this are, however, not biodegradable and, thus, are not compostable like the vapor deposited films and the sealing layer. Thus, they may interfere with compostation.

In order to save energy, coated architectural glass is frequently employed today. Depositing thin layers in a vacuum can yield coated glass panes with high thermal insulation properties and/or sun-protection properties. Films are coated for the same reason and can be deposited onto the glass panes. Films of this type are coated on one side, that is, the functional layer lies, for example, exposed on the glass prior to lining and can, therefore, easily be damaged, mechanically or in view of their sensitivity to environmental influences, e.g., a silver coating which is sensitive to chlorine- or sulfur-containing compounds.

For electro-optical components, such as liquid crystal displays, electrically conductive coatings which are transparent to visible light are utilized, for example, on glass or plastic. In this case, too, the deposited layer is exposed and can be easily damaged during subsequent processing.

A composite film is known from GB 2 064 427 A. Although it is produced without a lining adhesive, the resulting functional intermediate layer is, however, vapor deposited, which prevents oxidation of the metal surface prior to adhesion developing due to its getter effect. The result, however, is the production of composite films which do not have a transparent barrier layer.

All composite films having transparent intermediate functional layers to date, therefore, have the disadvantage that they are produced using a lining adhesive and, consequently, cannot be easily recycled or cannot be recycled at all, as well as having to accept the additional drawback of even more greatly diminished barrier properties.

The composite films fabricated according to GB 2 064 427 A have an intermediate functional layer deposited without a lining adhesive, however, this intermediate functional layer has the decisive drawback that it is metallic and not transparent and therefore cannot be used for the just-described applications.

On the basis of this, it is an object of the present invention to provide a process with which composite films can be produced without employing a lining adhesive, while simultaneously demanding that there are no restrictions regarding the function of the layer.

SUMMARY OF THE INVENTION

This object is accomplished by the present invention which provides a process for fabrication of a composite film including two films, comprising: depositing by evaporation in a vacuum at least one intermediate functional layer which is non-metallic and transparent, and which functions as at least one of a barrier layer or a bonding layer, onto at least one of the two films; and joining the two films under conditions effective to create a bond therebetween; wherein, when at least one intermediate functional layer is deposited onto each of the two films, these two films are joined together along the surfaces thereof which carry the deposited at least one intermediate functional layer, and when at least one intermediate functional layer is deposited onto only one film of the two films, the one film is joined to the other of the two films along the surface of the one film which carries the deposited at least one intermediate functional layer.

Preferably the at least one intermediate functional layer is deposited by evaporation in a vacuum of at least one starting compound selected from the group consisting of group (a) oxides, metal halogenides, sulfides, tellurides or selenides of elements of Groups II–IV of the Periodic Table of Elements including transition elements and lanthanide elements; group (b) glass; and group (c) organic monomers for a plasma polymer or a mixture of plasma polymers. Moreover, when monomers for a plasma polymer or a mixture of plasma polymers are employed, the at least one intermediate functional layer has a layer thickness ranging from 10 to 1000 nm.

Most preferably, the at least one starting compound is selected from the starting compounds of group (a) and is at least one compound selected from the group consisting of aluminum oxide, cerium oxide, hafnium oxide, magnesium oxide, silicon dioxide, silicon monoxide, tantalum oxide, titanium oxide, titanium (3) oxide, titanium monoxide, yttrium oxide, zirconic oxide, zirconic monoxide, lead fluoride, calcium fluoride, cerium fluoride, cryolite, lanthanum fluoride, magnesium fluoride, neodymium fluoride, thorium fluoride, cadmium sulfide, zinc sulfide, lead telluride, cadmium telluride, zinc telluride, cadmium selenide, and zinc selenide.

The process may be performed by depositing at least one intermediate functional layer between two films as the two films are directed over respective vaporization drums, which films are contemporaneously or subsequently joined together between the two vaporization drums to sandwich the at least one intermediate functional layer therebetween. Thus, the process may be performed by depositing two intermediate functional layers, one such intermediate functional layer being deposited onto each of said two films as the films are directed over respective vaporization drums and are joined together between the two vaporization drums. Alternatively, the process may be performed by depositing an intermediate functional layer onto a first film as the first film is directed over a vaporization drum, and subsequently joining a second film to the first film along the surface thereof which carries the intermediate functional layer. Additionally, the process may be performed so that three intermediate functional layers are deposited, one intermediate functional layer being deposited onto each of said two films as the respective films are directed over respective vaporization drums, and another intermediate functional layer being deposited thereafter between said two films which films are contemporaneously or subsequently joined together between the two vaporization drums to sandwich the three intermediate functional layers therebetween. Further, the process may additionally include depositing a metal layer which has a thickness effective to render the metal layer transparent between two intermediate functional layers which are non-metallic and transparent.

The at least one intermediate functional layer may be deposited by means of thermal vacuum evaporation, by means of chemical vapor deposition (CVD), or by means of cathode sputtering, as may be the metal layer.

The composite film may be comprised of two identical films or two different films. The two films may be comprised of at least one substance selected from the group consisting of polyesters, polypropylenes, polyethylenes, polyamides, polycarbonates, regenerated celluloses, cellulose acetates, polyhydroxybutyric acids and copolymers thereof, starch-based plastics, plastics having a starch additive, aliphatic polycarbonates and polyesters including polycaprolactones, polylactic acids, polylactic acid copolymers, polyethylene succinates, polybutylene succinates, polypetides, polysaccharides, paper, and cardboard, or other biodegradable materials, as well as combinations thereof as a composite or mixture, respectively in coated form.

When the at least one starting compound is selected from group (c), the at least one intermediate functional layer may be deposited by means of a plasma source.

The process may further comprise pretreating the surfaces of the films prior to vacuum evaporation of the at least one intermediate functional layer thereon. The pretreating may be accomplished by means of a plasma source.

With the present invention, for the first time, an adhesive-free and therefore fully recyclable composite film can be fabricated with substantially improved barrier properties compared to the starting materials. The transparent, non-metallic, barrier layer works simultaneously as a bonding layer and this solves the problem that prior art polymeric composite films are very difficult, and even impossible, to recycle due to the lining adhesive they contain.

Now, if biodegradable films are selected, a completely biodegradable polymeric composite film can be produced. Compostation, therefore, presents no problems.

An element of the present invention is that the transparent intermediate functional layer is produced during the fabrication of the composite by placing the intermediate functional layer between two films during a one-step procedure by a suitable process known in the art. Surprisingly, it has turned out that non-metallic, functional intermediate layers permit producing a composite having an intermediate layer which simultaneously acts as a bonding layer and a barrier layer. Contrary to the disclosure of GB 2 064 427 A, transparent layers are also produced if the thickness of the layers ranges between 10 and 1000 nm.

According to GB 2 064 427 A, it is important for the formation of a good bond that the oxygen present is gettered by means of the metal to be vapor deposited and therefore does not result in oxidation of the bonding layer. Consequently, it was to be anticipated that oxide compounds would not be suitable for this type of an intermediate functional layer simultaneously having barrier and bond forming effects.

Contrary thereto, the oxygen present has proven not to interfere in the inventive composites. In vacuum evaporation, e.g., of oxides, the presence of oxygen has even the advantage that the loss of oxygen resulting in the formation of suboxides is compensated for. Strikingly, with the inventive process, transparent barrier layers are fabricated which simultaneously act as a bonding layer.

All state of the art non-metallic starting compounds for the production of thin layers and coatings, and for the production of optic materials are suitable as non-metallic starting compounds for the process according to the present invention.

A comprehensive representation of suitable materials can be found in Haefer, R. A., Oberflächen-und Dünnschicht-Technologie, Teil I, "Beschichtung von Oberflächen", Berlin, Springer-Verlag (1987).

Especially preferred are all oxide compounds, metal halogenides, sulfides, tellurides, or selenides of Groups II–IV of the Periodic Table of Elements including the transition elements and the lanthanides. Groups II–IV of the Periodic Table of Elements is intended to include Groups IIA, IIB, IIIA, IIIB, IVA, and IVB, as well as the transition elements and the lanthanides. Other suitable starting compounds are glass, as well as organic monomers for plasma polymerization.

Of the oxide compounds, especially suited are aluminum oxide, cerium oxide, hafnium oxide, magnesium oxide, silicon dioxide, silicon monoxide, tantalum oxide, titanium dioxide, titanium (3) oxide, titanium monoxide, yttric oxide, zirconic oxide, zirconic monoxide, and the like or mixtures thereof.

Of the fluorides, especially preferred are: lead fluoride, calcium fluoride, cerium fluoride, cryolite, lanthanum fluoride, magnesium fluoride, neodymium fluoride, and thorium fluoride.

Of the sulfides, especially preferred are: cadmium sulfide and zinc sulfide, of the tellurides: lead telluride, cadmium telluride and zinc telluride, of the selenides: cadmium selenide and zinc selenide.

Of the organic monomers, three groups are suited for plasma polymerization:

Group I

Acrylic acid, acrylonitrile, ferrocene, methyl methacrylate, styrene, and vinyl ferrocene.

Group II

Acetylene, aniline, ethylene, benzene, butadiene, cyclohexane, diethyl vinyl silane, divinyl benzol, hexamethylene disiloxane, hexamethylene disilazane, methyl ethylene, N-vinyl pyrrolidone, propylene, propylene oxide, pyridine, 1,3,5-tri-chlorobenzene, tetramethyl silane, toluene, triethylene silane, vinyl acetate, and xylene.

Group III

Chlorodifluoromethane, chlorotrifluoroethylene, hexafluoropropane, hexafluoropropylene, hydroperfluoropropane, perfluorobutene-2, tetrafluoroethylene, and trifluoroethylene.

Thus, with the inventive process, polymeric composite films having one, two, three or more intermediate functional layers can be produced. The number of intermediate functional layers depends on the respective demands made on the polymeric composite film. Accordingly, depending on the circumstances, one or two or three intermediate functional layers can be deposited sequentially, with the starting materials being selected accordingly.

A preferred embodiment proposes additionally depositing a metallic layer which is sufficiently thin to be transparent in addition to the non-metallic, transparent, intermediate functional layers. This metallic layer serves, e.g., in the case of silver, to generate thermal insulation without a sun-protection effect. Suitable metals include all metals for generating thin layers known in the state of the art, e.g., aluminum, antimony, lead, cadmium, iron, gallium, germanium, silver, etc.

Another element of the present invention is that the nonmetallic materials and, in the preferred embodiment having at least one metallic layer, also the metallic materials, are deposited on the films during the formation of the composite films.

The intermediate functional layers can be deposited onto the films using any of the processes known in the state of the art. Fundamentally suitable are thermal evaporation, cathode sputtering, and chemical vapor deposition (CVD). If organic substances are employed, plasma polymerized layers can be formed on the films by using a plasma. Processes of this type can also be conducted with or without additional evaporation. Additional stimulation using a plasma, e.g., employing microwave coupling, to generate an organic adhesive layer is preferred.

The polymer composites can be built up from two identical films or from at least one intermediate functional layer and two different films. Possible films include all films mentioned in the state of the art, such as, polyesters, polypropylenes, polyethylenes, polyamides, polycarbonates, regenerated celluloses, cellulose acetates, polyhydroxy butyric acids and its copolymers, starch-based plastics or plastics with starch additives, aliphatic polycarbonates and polyesters, such as, polycaprolactones, polylactic acids, polylactic acid copolymers, polyethylene succinates and polybutylene succinates, polypeptides, polysaccharides, paper, cardboard or other biodegradable materials, as well as combinations thereof as a composite or mixture, respectively coated form.

As the inventive at least one intermediate functional layer is already embedded between two films during its production, it is well protected against mechanical influences and other environmental influences both during production and during further processing steps, and is therefore less sensitive.

Films having thermal insulation and/or sun-protective effects, respectively films which are electrically conductive and transparent to light, can be lined during production. The functional layer is excellently protected due to embedding between two plastic films. Films of this type possess substantial advantages both in further processing, e.g., little danger of mechanical or even chemical damage, and in use, e.g., direct use without other carriers.

BRIEF DESCRIPTION OF THE DRAWINGS

Other details, features and advantages of the present invention are made known by the following description of FIGS. 1 to 5, as well as by the preferred embodiments 1 to 5. Thus, the subject of the invention is described in more detail by means of drawings in which.

DESCRIPTION OF THE PREFERRED EMBODIMENTS

Figure 1:
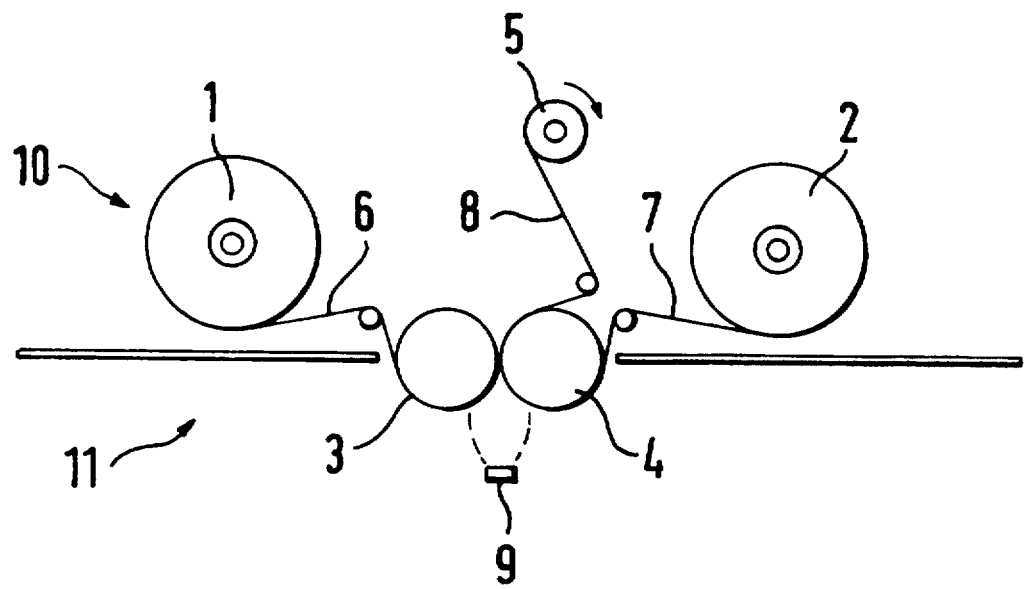
FIG. 1 diagrammatically shows the structure of an exemplary high-vacuum film roll vaporization plant with one evaporator.

In the preferred embodiment of FIG. 1, the high-vacuum film roll vaporization plant is composed of a winding chamber 10 and a vaporization chamber 11. Two sheet or panel-like films 6, 7 are unwound from drums 1, 2 of the winding chamber 10, and, via two vaporization drums 3, 4, are joined in the vaporization chamber 11. From evaporator 9, evaporation stock, e.g., a starting compound composed of oxide compound(s), is vaporized into a vaporization gap 19 defined between the two drums 3 and 4. The evaporation stock condensing on films 6, 7 joins the substrates 6, 7 and simultaneously forms a barrier layer. Polymer composite film 8 is wound onto a drum 5 as it is thus formed.

The inventive process can be carried out, as shown in FIG. 1, with a two-chamber plant having films 6, 7 within chambers 10, 11, or in a single-chamber plant, or in a so-called "air-to-air plant" in which the films 6, 7 are introduced into the actual vaporization chamber, and run through it, via locks.

Besides conventional thermal evaporators, such as boats or large troughs, which can be heated directly by means of resistance heating, inductively, or indirectly by means of radiation, electron-beam evaporators or magnetrons can also be employed as sources of evaporation. In addition, for activation, a plasma can be coupled into the vaporization zone.

The utilized films can, moreover, be pretreated in the plant prior to vaporization, e.g., using a plasma or glow-discharge.

Figure 2:
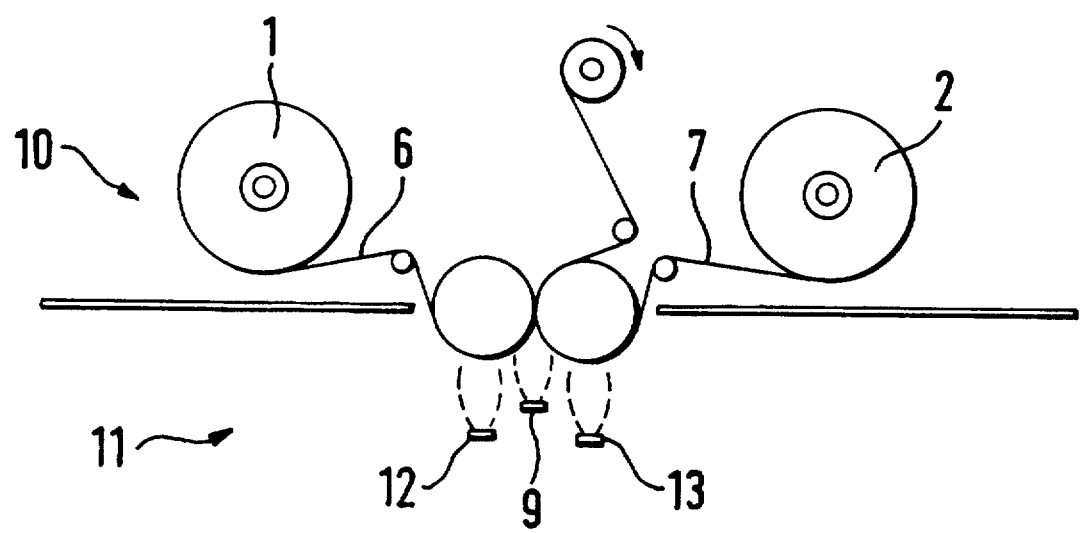
FIG. 2 diagrammatically shows the exemplary structure of a high-vacuum film roll vaporization plant with several evaporators.

FIG. 2 shows another preferred embodiment according to FIG. 1 having several evaporation sources. With this process mode, additional substances can be vapor deposited onto films 6, 7 from additional evaporators 12 and 13 prior to actual joining together of films 6, 7. Basically, as shown in FIG. 2, three evaporators or, alternatively, only two evaporators can be used. The middle layer deposited from evaporator 9 can be composed of a non-metallic material or a metal which promotes bonding and is so thin that it is transparent.

Oxide compounds, metal halogenides or even glass can be deposited by means of evaporators 12 and 13. In this manner, additional substances can be deposited onto the films prior to the actual bonding upon joining. Organometallic substances can also be added which react in a plasma (not depicted) before films 6, 7 reach the vaporization gap 19 to provide a bonding layer by the well known chemical vapor deposition (CVD) process. If organic substances, such as, styrene, hexamethyl disiloxane, acetylene, ethylene, etc. are employed, plasma polymerized layers can be produced with the plasma present. Processes of this type can also be carried out without additional evaporators 12, 13.

Figure 3:
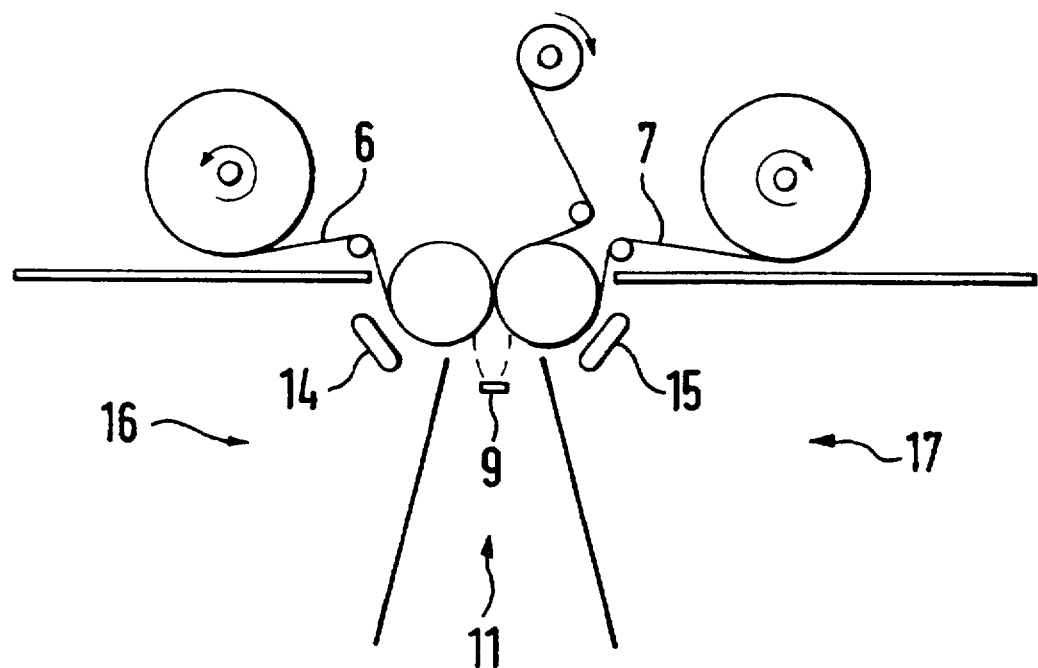
FIG. 3 diagrammatically shows the exemplary structure of a film roll vaporization plant for generating, e.g., thermal insulating and sun-protective composite films.

FIG. 3 shows yet another preferred embodiment in which evaporators 12 and 13 are replaced by sputter sources 14, 15 which are arranged in sputter chambers 16, 17. Even in this embodiment of the inventive process, the individual films 6, 7 are coated with separate intermediate functional layers prior to undergoing joining and bonding. This process can, of course, also be combined with a plasma.

Figure 4:
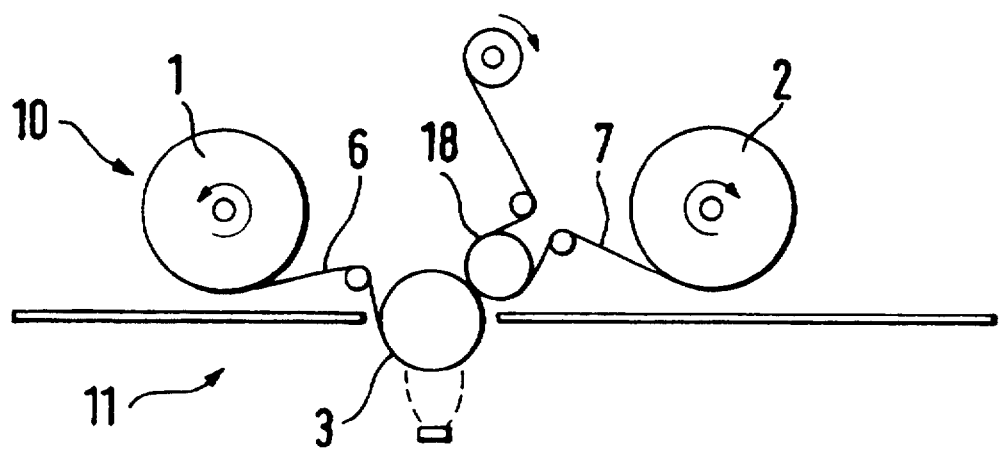
FIG. 4 diagrammatically shows an embodiment of the exemplary structure of a high-vacuum film roll vaporization plant having a vaporization drum.

FIG. 4 shows a further preferred embodiment of the inventive process in which an intermediate functional layer is first deposited on a film 6 fed via a vaporization drum 3 and, subsequently, film 7 is joined.

Strikingly, it has been discovered that it is not essential for bonding between two films by means of vaporization for both films to be vaporized in the gap 19 between the two vaporization drums 3,4. Rather, it suffices if only one film is vaporized and a single vaporization drum 3 is therefore sufficient. The second film 7 is fed in after vaporization of the first film 6 and joined to the first film 6 by, e.g., pressing film 7 onto the vaporization drum 3 carrying film 6 onto the vaporized side of film 6 by means of a pressing drum 18.

In order to be able to bond the two films 6, 7, the vapor deposited layer has to be reactive to the fed film surface and high pressure has to be exerted in order to obtain a close contact of the surfaces. If, e.g., silicon monoxide is vapor deposited, the vapor deposited $SiO_x$ layer absorbs more oxygen. If a smooth film surface having correspondingly reactive groups (e.g., corona pretreated polypropylene) is brought into close contact with the still reactive $SiO_x$ layer, a bond is formed.

Any material yielding a reactive surface can be utilized as the vacuum evaporation starting material. Such starting materials, e.g., silicon monoxide or titanium monoxide, after being vapor deposited, react, such as, by absorbing oxygen.

Any film, the surface of which can form a bond with the reactive surface of the vacuum evaporated layer, for example, by supplying oxygen, can be utilized for the fed films 6, 7. The surfaces of the films should be as smooth as possible in order to permit a contact therebetween which is as close as possible. The film can be coextruded for this purpose or varnished, that is, coated. An activation of the film surface can occur, e.g., by pretreatment with, for example, corona, flaming, plasma, glow-discharge or treatment using, a substance, such as, ozone gas within or outside of the vaporization plant.

FIG. 5 shows the composite films produced using the inventive process.

Figure 5A:
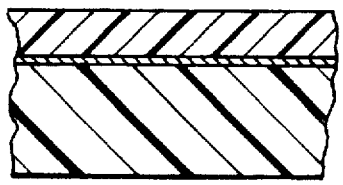
FIG. 5 shows various inventive composite films.

FIG. 5a shows a barrier layer composite 20, without a lining adhesive, which includes an oriented polypropylene film 22 having a layer thickness of 20 µm, a $SiO_x$ barrier layer 24, and a sealable polypropylene film 26 having a layer thickness of 50 µm.

Figure 5B:
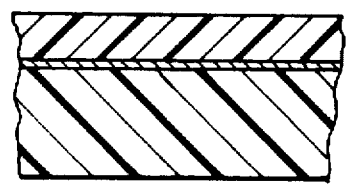

FIG. 5b shows a biodegradable barrier composite 30, without a lining adhesive, which includes a PHB-V as substrate 32 (16 µm), a $SiO_x$ barrier and bonding layer 34, and a film 36 of thermoplastic starch having a layer thickness of 50 µm as the second film 36.

Figure 5C:
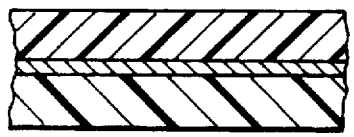

FIG. 5c shows a composite 40 which is a thermal insulating layer 43 protected between two polyester films 42, 48 which simultaneously function as carriers. This composite is built up in such a manner that the middle functional layer is a silver layer 45 which is surrounded by indium oxide/zinc oxide functional layers 44, 46. In this case, a PET protection and carrier film functions as the two polyester films 42, 48.

Figure 5D:
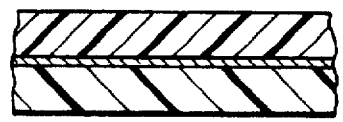

FIG. 5d shows a composite 50 which is an optically transparent, electrically conductive oxide layer 54 protected by two polyester films 52, 56. In this case, an indium oxide/zinc oxide layer 54 protected by PET protective carrier films 52, 56 acts as the functional layer 54.

EXAMPLE 1

According to FIG. 1, a 20 µm thick biaxially oriented polypropylene film 6, 22 and a 70 µm thick cast polypropylene film 7, 26 (sealable) were each vapor deposited with 100 nm $SiO_x$ to provide barrier layer 24. In this way, a recyclable polypropylene composite 20, depicted in FIG. 5a, was prepared in which the barrier layer 24 is already embedded during production and therefore protected against damage. The composite 20 can be utilized, for example, as packaging material.

EXAMPLE 2

According to FIG. 1, a 16 µm thick biaxially oriented film 6, 22 of polyhydroxybutryl acid—hydroxyvaleric acid copolymer and a 50 µm thick film 7, 26 of thermoplastic starch were each vapor deposited with 100 nm $SiO_x$ to provide barrier layer 24. The composite 20 (see FIG. 5b) produced in this manner is biodegradable and compostable, and can be utilized, for example, for non-durable packaging. The barrier layer 24 is already protected during production and is therefore less sensitive.

EXAMPLE 3

According to FIG. 3, two polyester films 6, 7 (42, 48) were each coated with a mixture of indium oxide and zinc oxide 44, 46 in the sputter chambers 16 and 17, respectively. The coated films are joined in the vaporization chamber 11, with silver 45 being evaporated into gap 19 between the two vaporization drums 3, 4. A "sandwich" 43 including layers 44, 45, 46 produced in this manner can be, for example, deposited self-contained or onto glass as a thermal insulating film. By embedding the functional layer sandwich 43 between two polyester films 42, 48, the functional layer sandwich 43 is advantageously protected (see FIG. 5c).

EXAMPLE 4

According to FIG. 1, the evaporator 9 was replaced by a cathode sputtering device 9' (not shown) with indium oxide containing zinc oxide additives being sputtered into the gap 19 between two polyester films 6, 7 (52, 56). In this manner, an electrically conductive layer 54 which is transparent to visible light and which is protectively embedded between two polyester films 52, 56 was obtained (see FIG. 5d). The material produced in this way can be used, for example, for electro-optical components.

EXAMPLE 5

A 20 µm thick OPP film 6 was vapor deposited with 100 nm $SiO_x$ analogously to FIG. 4 onto a slightly modified conventional film roll vaporization plant. In this case, a 70 µm thick, sealable coextruded cast PP film 7 was fed to the vaporization drum 3 (following vaporization) and was pressed with great force by means of a pressing drum 18 onto the vapor deposited side of the substrate 6. The coextruded cast PP film 7 was composed of a layer 7a which was free of additives and a conventional layer 7b having an antiblock material. The additive-free layer 7a was pretreated with corona. This side of the film contacts the silicon oxide layer. The double-layered film formed in the vaporization plant in this manner was wound jointly onto a roll 60. For bonding, this roll 60 was stored in a pressure chamber under high pressure immediately following completion. After the reaction of the vacuum deposited silicon oxide layer, a firm, recyclable composite having a $SiO_x$ barrier layer as the bonding layer was produced.

The invention has been described in detail with respect to preferred embodiments, and it will now be apparent from the foregoing to those skilled in the art that changes and modifications may be made without departing from the invention and its boarder aspects, and the invention, therefore, in the appended claims is intended to cover all such changes and modifications as fall within the true spirit of the invention.

What is claimed is:

1. A process for fabrication of a composite film including two films, comprising:
    depositing by evaporation in a vacuum at least one intermediate functional layer which is non-metallic and transparent, and which functions as at least one of a barrier layer or a bonding layer, onto at least one of said two films; and
    joining the two films under conditions effective to create a bond therebetween but without any lining adhesive;
    wherein, when at least one intermediate functional layer is deposit onto each of the two films, these two films are joined together along the surfaces thereof which carry the deposited at least one intermediate functional layer, and when at least one intermediate functional layer is deposited onto only one film of the two films, the one film is joined to the other of the two films along the surface of the one film which carries the deposited at least one intermediate functional layer.

2. The process according to claim 1, wherein the at least one intermediate functional layer is deposited by evaporation in a vacuum of at least one starting compound selected from the group consisting of
    group (a): oxides, metal halogenides, sulfides, tellurides or selenides of elements of Groups II–IV of the Periodic Table of Elements including transition elements and lanthanides elements;
    group (b): glass; and
    group (c): organic monomers for a plasma polymer or a mixture of plasma polymers.

3. The process according to claim 2, wherein the at least one starting compound is selected from group (c), and wherein the at least one intermediate functional layer has a thickness ranging from 10 to 1000 nm.

4. The process according to claim 2, wherein the at least one starting compound is selected from the starting compounds of group (a) and is at least one compound selected from the group consisting of aluminum oxide, cerium oxide, hafnium oxide, magnesium oxide, silicon dioxide, silicon monoxide, tantalum oxide, titanium oxide, titanium (3) oxide, titanium monoxide, yttrium oxide, zirconium oxide, zirconium monoxide, lead fluoride, calcium fluoride, cerium fluoride, cryolite, lanthanum fluoride, magnesium fluoride, neodymium fluoride, thorium fluoride, cadmium sulfide, zinc sulfide, lead telluride, cadmium telluride, zinc telluride, cadmium selenide, and zinc selenide.

5. The process according to claim 1, wherein at least one intermediate functional layer is deposited between two films as the two films are directed over respective vaporization drums, which films are joined together between the two vaporization drums to sandwich the at least one intermediate functional layer therebetween.

6. The process according to claim 1, wherein at least one intermediate functional layer is deposited onto a first film as the first film is directed over a vaporization drum, and wherein a second film is subsequently joined to the first film along the surface thereof which carries the intermediate functional layer.

7. The process according to claim 1, wherein two intermediate functional layers are deposited, one intermediate functional layer being deposited onto each of said two films as the two films are directed over respective vaporization drums and are joined together between the two vaporization drums.

8. The process according to claim 1, wherein three intermediate functional layers are deposited, one intermediate functional layer being deposited onto each of said two films as the respective films are directed over respective vaporization drums, and another intermediate functional layer being deposited thereafter between said two films, which films are joined together between the two vaporization drums to sandwich the three intermediate functional layers therebetween.

9. The process according to claim 1, further comprising depositing a metal layer, which has a thickness effective to render the metal layer transparent, between two intermediate functional layers.

10. The process according to claim 1, wherein the at least one intermediate functional layer is deposited by means of thermal vacuum evaporation.

11. The process according to claim 1, wherein the at least one intermediate functional layer is deposited by means of chemical vapor deposition (CVD).

12. The process according to claim 1, wherein the at least one intermediate functional layer is deposited by means of cathode sputtering.

13. The process according to claim 1, wherein the composite film is composed of two identical films.

14. The process according to claim 1, wherein the composite film is composed of two different films.

15. The process according to claim 1, wherein the two films are comprised of at least one substance selected from the group consisting of polyesters, polypropylenes, polyamides, polycarbonates, regenerated celluloses, cellulose acetates, polyhydroxybutyric acids and copolymers thereof, starch-based plastics, plastics having a starch additive, aliphatic polycarbonates and polyesters including polycaprolactones, polylactic acids, polylactic acid copolymers, polyethylene succinates, polybutylene succinates, polypetides, polysaccharides, paper, and cardboard, or other biodegradable materials, as well as combinations thereof as a composite or mixture, respectively in coated form.

16. The process according to claim 2, wherein the at least one starting compound is selected from group (c), and wherein depositing the at least one intermediate functional layer is by means of a plasma source.

17. The process according to claim 1, further comprising pretreating the surfaces of the films prior to vacuum evaporation of the at least one intermediate functional layer thereon.

18. The process according to claim 17, wherein pretreating is accomplished by means of a plasma source.

19. A composite film comprised of two films and at least one intermediate functional layer provided between the two films but without any lining adhesive, which at least one intermediate functional layer is non-metallic and transparent, and functions as at least one of a barrier layer or a bonding layer, the composite film being produced according to the process of claim 1.

20. The process according to claim 2, wherein the at least one intermediate functional layer is deposited by thermal evaporation in a vacuum of at least one starting compound of group (a), which is aluminum oxide, and the two films comprise polyester.

* * * * *